US008559217B2

(12) United States Patent
Dubourdieu et al.

(10) Patent No.: US 8,559,217 B2
(45) Date of Patent: *Oct. 15, 2013

(54) PHASE CHANGE MATERIAL CELL WITH STRESS INDUCER LINER

(75) Inventors: Catherine A. Dubourdieu, New York, NY (US); Martin M. Frank, Dobbs Ferry, NY (US); Bipin Rajendran, New York, NY (US); Alejandro G. Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 313 days.

This patent is subject to a terminal disclaimer.

(21) Appl. No.: 12/964,980

(22) Filed: Dec. 10, 2010

(65) Prior Publication Data

US 2012/0147666 A1 Jun. 14, 2012

(51) Int. Cl.
*G11C 11/00* (2006.01)
(52) U.S. Cl.
USPC ............ 365/163; 365/148; 365/157; 365/145
(58) Field of Classification Search
USPC ................... 365/163, 148, 157, 145; 257/2–5
See application file for complete search history.

(56) References Cited

U.S. PATENT DOCUMENTS

| | | | | |
|---|---|---|---|---|
| 5,592,413 | A * | 1/1997 | Spitzer | 365/151 |
| 8,031,518 | B2 * | 10/2011 | Meade | 365/163 |
| 2005/0146249 | A1 | 7/2005 | Miyazawa et al. | 310/358 |
| 2010/0001620 | A1 | 1/2010 | Yuuya et al. | 310/336 |

OTHER PUBLICATIONS

Mitra et al., "Extremely Low Drift in Amorphous Phase Change Nanowire Materials" Dept. of Materials Science and Engineering, University of Pennsylvania, pp. 1-15 (publication date unknown).
Han et al., "Effect of Pressure on the Amorphous Structures of Ge2Sb2Te5 and Its Implications to the Mechanism of Resistance Drift" Application Design and Programming CopyrightScholarOne, Inc., Abstract No. H5.2 (publication date unknown).
Cheng et al., "The impact of film thickness and melt-quenched phase on the phase transition characteristics of Ge2Sb2Te5" Journal of Applied Physics 107, 074308, pp. 1-9 (Apr. 12, 2010).
Caravati et al., "Unravelling the Mechanism of Pressure Induced Amorphization of Phase Change Materials" Physical Review Letters, PRL 102, 205502, pp. 1-4 (2009).
Fons et al., "High-pressure induced structural changes in metastable Ge2Sb2Te5 thin films: An X-ray absorption study" Nucl. Instr. and Meth. in Phys. Res. B 238 (2005) 160-162.
Setter et al., "Ferroelectric thin films: Review of materials, properties, and applications" Journal of Applied Physics 100, 051606 (2006) pp. 1-46.
Kolobov et al., "Pressure-Induced Site-Selective Disordering of Ge2Sb2Te5: A New Insight into Phase-Change Optical Recording" Physical Review Letters, PRL 97, 035701 (2006).
Jo et al., "Ultrahigh-density phase-change data storage without the use of heating" Nature Nanotechnology, vol. 4 (Nov. 2009) 727-731.
Muralt et al., "Vibration Energy Harvesting with PZT Micro Device" Procedia Chemistry 1 (2009) 1191-1194.

* cited by examiner

*Primary Examiner* — David Lam
(74) *Attorney, Agent, or Firm* — Ido Tuchman; Vazken Alexanian (57) ABSTRACT

An example embodiment disclosed is a phase change memory cell. The memory cell includes a phase change material and a transducer positioned proximate the phase change material. The phase change material is switchable between at least an amorphous state and a crystalline state. The transducer is configured to activate when the phase change material is changed from the amorphous state to the crystalline state. In a particular embodiment, the transducer is ferroelectric material.

17 Claims, 8 Drawing Sheets

PHASE CHANGE MATERIAL CELL WITH STRESS INDUCER LINER

BACKGROUND

The present invention is directed toward computer memory, and more particularly to a non-volatile phase change memory device.

There are two major groups in computer memory: non-volatile memory and volatile memory. Constant input of energy in order to retain information is not necessary in non-volatile memory but is required in the volatile memory. Examples of non-volatile memory devices are Read Only Memory, Flash Electrical Erasable Read Only Memory, Ferroelectric Random Access Memory, Magnetic Random Access Memory, and Phase Change Memory. Examples of volatile memory devices include Dynamic Random Access Memory (DRAM) and Static Random Access Memory (SRAM). The present invention is directed to phase change memory.

In phase change memory, information is stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase. Furthermore, the amorphous and crystalline phases in phase change material are reversible.

Glass chalcogenides are a group of materials commonly utilized as phase change material. This group of materials contain a chalcogen (Periodic Table Group 16/VIA) and a more electropositive element. Selenium (Se) and tellurium (Te) are the two most common semiconductors in the group used to produce a glass chalcogenide when creating a phase change memory cell. An example of this would be $Ge_2Sb_2Te_5$ (GST), SbTe, and $In_2Se_3$. However, some phase change materials do not utilize chalcogen, such as GeSb. Thus, a variety of materials can be used in a phase change material cell as long as they can retain amorphous and crystalline states.

A phase change memory cell is programmed by applying a pulse of sufficient strength to alter the phase of the phase change material inside. This is typically achieved by applying an electrical pulse through the phase change material. When the initial state is amorphous, the electrical pulse has to overcome a threshold voltage (Vt), corresponding to a threshold electric field, before an avalanche current begins to flow. Due to ohmic heating, the phase change material changes its phase. A relatively high intensity, short duration current pulse with a quick transition at the trailing edge results in the phase change material melting and cooling quickly. The phase change material does not have the time to form organized crystals, thereby creating an amorphous solid phase. A relatively low intensity, long duration pulse allows the phase change material to heat and slowly cool, thus crystallizing into the crystalline phase. It is possible to adjust the intensity and duration of the pulses to produce a varying degree of resistance for multi-bit storage in a memory cell.

A phase change memory cell is read by applying a pulse of insufficient strength to program, i.e. to alter the phase of the material. The resistance of this pulse can then be read as a "1" or "0". The amorphous phase, which carries a greater resistance, is generally used to represent a binary 0 (reset state). The crystalline phase, which carries a lower resistance, can be used to represent a binary 1 (set state). In cells where there are varying degrees of resistance, the phases can be used to represent, for example, "00", "01", "10", and "11".

SUMMARY

An example embodiment of the present invention is a memory cell. The memory cell includes a phase change material and a piezoelectric transducer positioned proximate the phase change material. The phase change material is switchable between at least an amorphous state and a crystalline state. The transducer is configured to be activated when the phase change material is at the amorphous state.

In one embodiment, the piezoelectric transducer is a ferroelectric material. The phase change material and the ferroelectric material may be fabricated such that the electric field associated with the threshold voltage (Vt) of the phase change material is greater than the coercive field of the ferroelectric material. In this embodiment, the transducer can remain in a polarized state after the electric field is withdrawn.

In a second embodiment, the piezoelectric transducer is not a ferroelectric material. In this embodiment, the transducer acts only when the electric field is present.

Another example embodiment of the present invention is a method for operating a memory cell with a ferroelectric transducer proximate the phase change material. The method includes a poling step to polarize the ferroelectric material that is proximate the phase change material in an amorphous state. Furthermore, the method may include steps designed to stabilize the amorphous phase and also steps to increase the set speed of the phase change material.

Yet a further example embodiment of the invention is a process for fabricating a phase change memory cell. The method includes forming a bottom electrode, creating a pore in an insulating layer above the bottom electrode, depositing piezoelectric material in the pore, depositing phase change material in the pore proximate the piezoelectric material, and forming a top electrode over the phase change material. Depositing the piezoelectric material in the pore may include conforming the piezoelectric material to at least one wall defining the pore such that the piezoelectric material is deposited between the phase change material and the wall. The conformal deposition may be achieved by chemical vapor deposition (CVD) or by atomic layer deposition (ALD).

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to embodiments of the invention. Throughout the description of the invention reference is made to FIGS. 1-4.

Figure 1A:
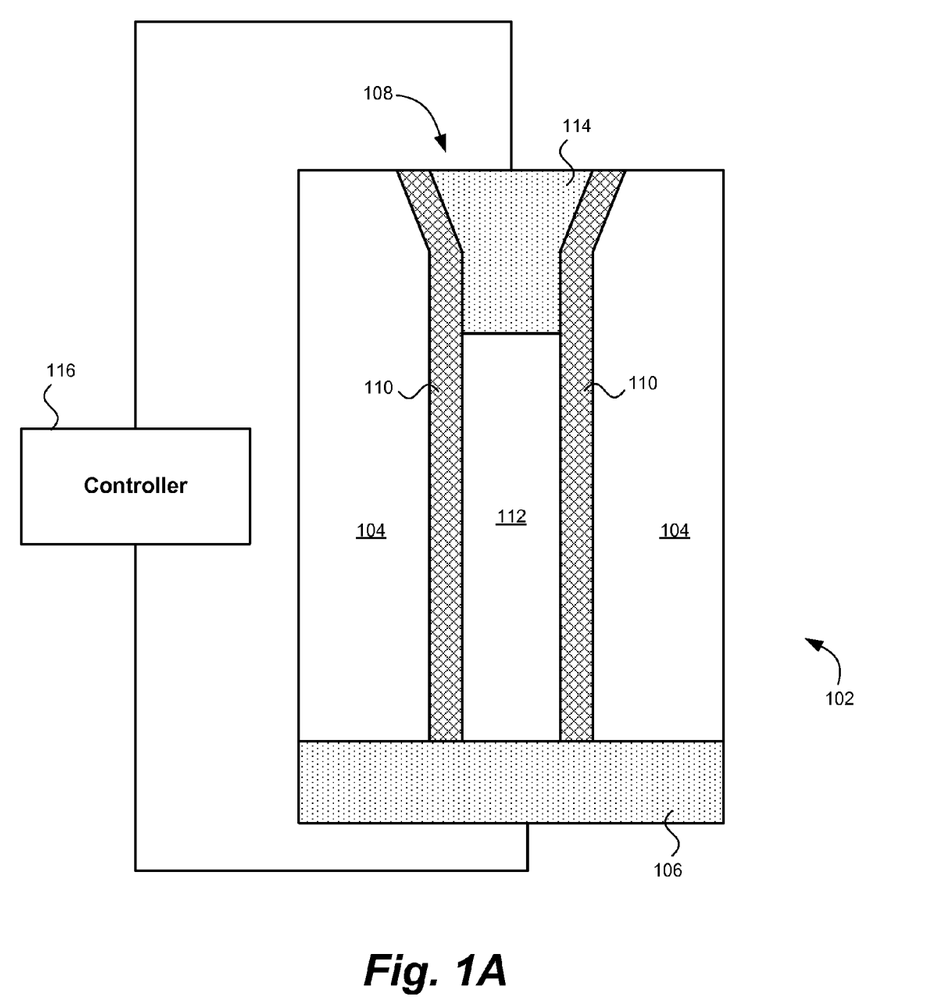
FIG. 1A illustrates a cross sectional view of an example memory cell contemplated by the present invention.

FIG. 1A illustrates the cross sectional view of an example memory cell 102 contemplated by the present invention. It is contemplated that the memory cell 102 is part of an array of memory cells packaged, for example, as a PCRAM integrated circuit. The exemplary memory cell 102 is comprised of an insulating layer 104, a bottom electrode 106 and a pore 108 within the insulating layer 104. The pore 108 is lined with a transducer layer 110 and filed with phase change material 112. The phase change material 112 is capped with a top electrode 114.

The memory cell 102 is typically formed on a substrate with metal-oxide-semiconductor field-effect transistors (MOSFETs) (not shown). Other switching devices known to those skilled in the art, such as junction FETs and bipolar junction transistors, may be used with the present invention.

The top and bottom electrodes 106 and 114 are electric conductors configured to create an electric field through the transducer layer 110 and phase change material 112. Various materials may be used to fabricate the electrodes 106 and 114, such as, but is not limited to, titanium nitride (TiN), tungsten (W), silver (Ag), gold (Au), tantalum nitride (TaN), tantalum silicon nitride (TaSiN), Ruthenium (Ru), or aluminum (Al).

The insulating layer 104 is electrically insulating and may additionally be thermally insulating. The insulating layer 104 may be composed of, for example, silicon dioxide ($SiO_2$). The pore 108 (sometimes referred to as a via) inside the insulating layer 104 may be formed using various known fabrication techniques, such a wet etch. In one embodiment of the invention, the depth of the pore 108 is approximately 500 nm for a 180 nm CMOS technology, and its aspect ratio is at least 2:1.

The pore 108 is lined with the transducer layer 110. The conformal transducer layer 110 is formed using various techniques known to those skilled in the art, such as a chemical vapor deposition (CVD), atomic layer deposition (ALD) and subsequent etch using an anisotropic process in order to open the bottom contact.

In one embodiment of the invention, the transducer layer 110 is comprised of a piezoelectric material. Various known piezoelectric materials may be used in the transducer layer 110, such as Aluminum Nitride (AlN) and zinc oxide (ZnO). The piezoelectric material is configured such that a voltage drop across the piezoelectric material causes a stress to be applied to the phase change material 112. Thus, the piezoelectric material acts as a transducer; converting electrical energy into mechanical energy. In other words, the stress imparted by the transducer is reprogrammable.

In one embodiment of the memory cell 102, the piezoelectric material is a ferroelectric material, such as lead zirconate titanate (PZT), $BaTiO_3$ (BTO), $YMnO_3$ (YMO), Pb $(Mg_{0.33} Nb_{0.66})_{1-x}Ti_xO_3$ (PMN-PT) or triglycine sulfate (TGS). The ferroelectric material is characterized at least by a coercive field and Curie temperature. The coercive field is the electrical field across the ferroelectric material necessary to switch polarization. The Curie temperature is a temperature above which the ferroelectric material does not exhibit a spontaneous polarization.

A layer of phase change material 112 is also deposited in the pore 108 proximate the transducer layer 110. As mentioned above, the phase change material 112 is switchable between at least an amorphous state and a crystalline state. The phase change material 112 may include such material as $Ge_2Sb_2Te_5$ (GST), SbTe, and $In_2Se_3$.

The phase change material in the pore is characterized at least by a threshold voltage, crystallization temperature, and a melting temperature. The threshold voltage is the voltage across the phase change material 112 necessary to generate an avalanche current to produce heat and change it from an amorphous state to a crystalline state. In one embodiment of the invention, the phase change material 112 and the ferroelectric material in the transducer layer 110 are fabricated such that the electric field associated with the threshold voltage of the phase change material 112 is greater than the coercive field of the ferroelectric material.

The crystallization temperature is the temperature above which the phase change material 112 at the amorphous state starts to crystallize. In one embodiment of the invention, the phase change material 112 and the ferroelectric material in the transducer layer 110 are fabricated such that the crystallization temperature of the phase change material 112 is less than the Curie temperature of the ferroelectric material. Thus, the stress imparted by the transducer layer 110 will continue even after the phase change material changes from the amorphous state to the crystalline state.

The melting temperature is the temperature above which the phase change material 112 starts to melt. In one embodiment of the invention, the phase change material 112 and the ferroelectric material in the transducer layer 110 are fabricated such that the melting temperature of the phase change material 112 is less than the Curie temperature of the ferroelectric material. Thus, the stress imparted by the transducer layer 110 will continue even after the phase change material reset state is refreshed.

It is noted that the example memory cell 102 shown is simplified for illustration purposes. It is contemplated that memory cell designs may employed without departing from the spirit and scope of the present invention. For example, the phase change material 112 may be only partially positioned between the bottom electrode 108 and the top electrode 114.

The memory cell may be coupled to a controller 116. As discussed in more detail below, the controller 116 is configured to activate the transducer layer 110 before the phase change material is changed from the amorphous state to the crystalline state. In one embodiment, an electrical pulse is applied to the transducer layer 110 by the controller 116. The amplitude of the electrical pulse is a voltage lower than the threshold voltage. This first electrical pulse causes the piezoelectric material to polarize such that the transducer applies a tensile stress upon the phase change material 112. By applying the tensile stress on the phase change material, the phase change material responds by stabilizing the amorphous phase through an increased threshold voltage and a reduced resistivity drift.

Figure 1B:
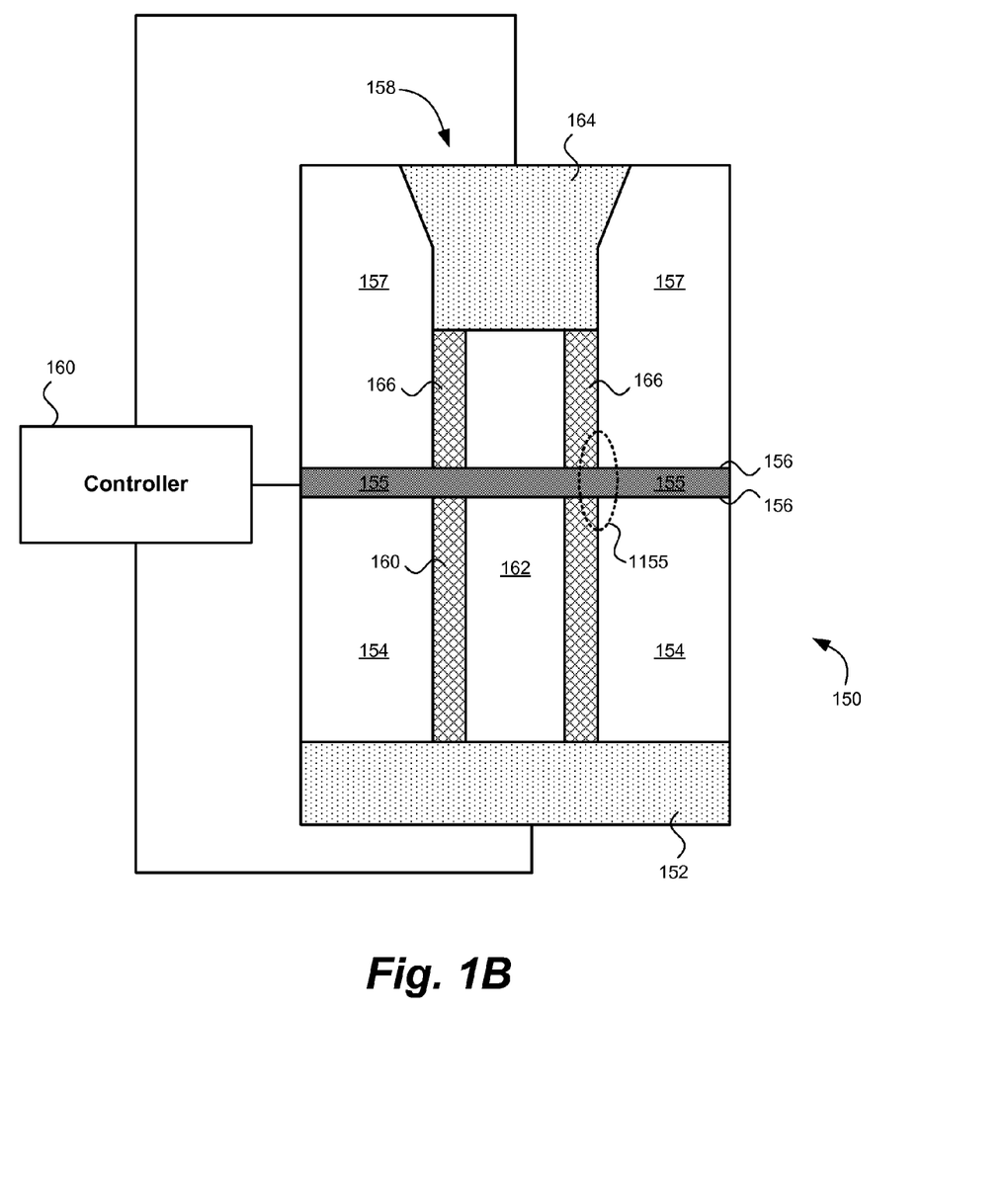
FIG. 1B illustrates a cross sectional view of another example memory cell contemplated by the present invention.

FIG. 1B shows another embodiment of an example memory cell 150 contemplated by the present invention. In this embodiment, the top electrode 164 is shown capping the transducer layer 166 and extending to the pore boundary. However, the memory cell 150 may be fabricated with a top electrode 164 formed within the transducer layer 166, as shown in FIG. 1A.

The memory cell 150 of FIG. 1B includes a bottom electrode 152 formed in an insulating substrate. A stack is formed by depositing a layer of insulating dielectric material 154, such as silicon oxide or silicon nitride, and a conductive layer 155. The conductive layer 155 is patterned to create conductive lines 156 centered above the bottom electrode. The cell 150 includes a transducer layer 166 that is comprised of ferroelectric material. Phase change material 162 is deposited in the pore proximate the transducer layer 166 and makes contact with the bottom electrode 152. A top electrode 164 is formed over the phase change material 162.

A controller 160 is configured to apply a first electrical pulse to the transducer layer 166. The amplitude of the electrical pulse is a voltage lower than the threshold voltage. This first electrical pulse causes the ferroelectric material to polarize and remain at the coercive value even after the pulse is withdrawn, such that the transducer applies a tensile stress upon the phase change material 162. By applying the tensile stress on the phase change material, the phase change material 162 responds by stabilizing the amorphous phase through an increased threshold voltage and a reduced resistivity drift.

In another embodiment, the controller 116 or 160 are configured to apply a second electrical pulse after changing the phase change material 112 or 162 from the crystalline phase to the amorphous phase. This second pulse is of opposite polarity than the first pulse but below V coercive (the voltage corresponding to the coercive field) and therefore causes the transducer to apply a compressive stress upon the phase change material 112 or 162. By applying the compressive stress on the phase change material 112 or 162, the phase change material lowers its resistivity and threshold voltage, which results in faster recrystallization.

It is noted that the embodiment using a ferroelectric as a transducer has many advantages compared to the one using a piezoelectric but non-ferroelectric transducer. After the polarizing step, the remnant polarization of the ferroelectric material leads to a remnant stress exerted on the phase change material. The direction of the stress exerted by the ferroelectric on the phase change material can be changed by changing the polarity of the voltage pulse applied to the ferroelectric material after it has been poled. In the latter situation, the ferroelectric material undergoes a compressive strain (and therefore exerts a compressive stress on the phase change material) when the applied electric field is opposite to the ferroelectric polarization. Conversely, the ferroelectric material exhibits further elongation and thus exerts a tensile stress on the phase change material when the applied electric field is parallel to the ferroelectric polarization. In addition, the piezoelectric coefficients which relate the strain with the applied voltage are higher in the case where the piezoelectric material is also ferroelectric.

Figure 2:
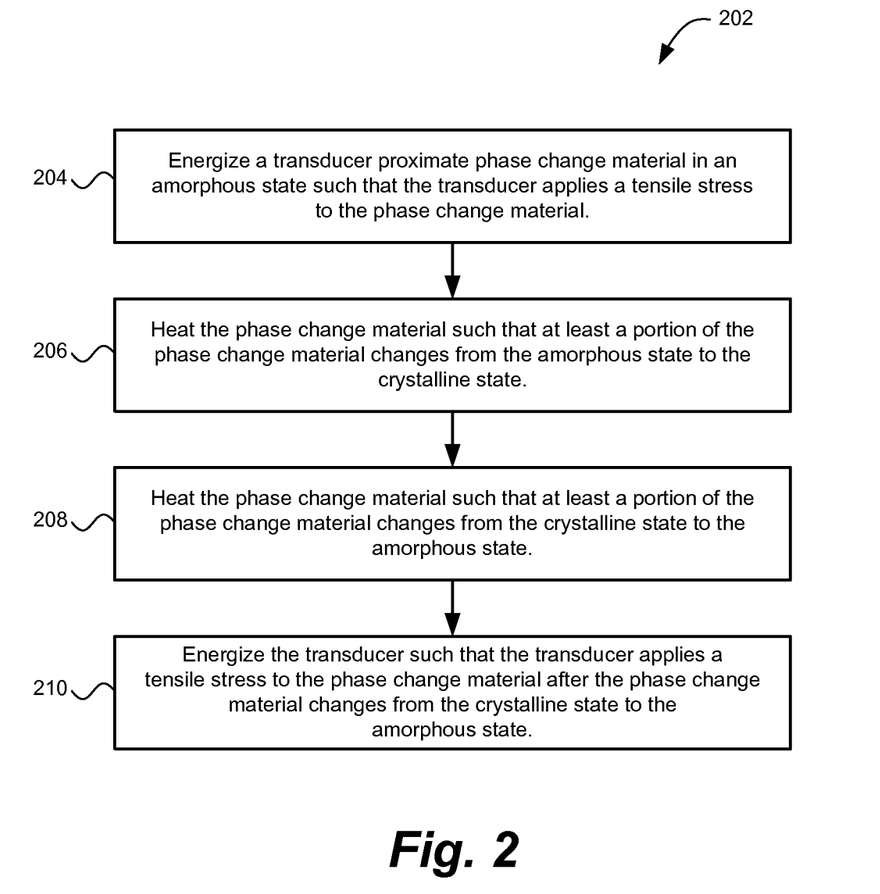
FIG. 2 shows example flowchart for operating a memory cell contemplated by the present invention.

Turning now to FIG. 2, an example flowchart 202 for operating a memory cell contemplated by the present invention is shown. As will be appreciated by one skilled in the art, aspects of the invention may be embodied as a system, method or computer program product. Accordingly, aspects of the invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the invention may take the form of a computer program product embodied in one or more computer readable medium(s) having computer readable program code embodied thereon.

The process begins at energizing operation 204. During this step, a transducer proximate phase change material in an amorphous state is energized. This causes the transducer to apply a tensile stress to the phase change material. As mentioned above, this stress lowers the amorphous phase change material's resistivity and threshold voltage, which results in faster recrystallization.

The electric current is configured such that a voltage drop across the piezoelectric material is less than a threshold voltage of the phase change material. After the energizing operation 204 is completed, the process proceeds to heating operation 206.

Next, at heating operation 208, the phase change material is heated such that at least a portion of the phase change material changes from the crystalline state to the amorphous state. In other words, the temperature of phase change material is raised above its melting temperature. During this operation the transducer cannot be activated because the crystalline state is conducting and the phase change material shunts the piezoelectric actuator In one embodiment, the transducer maintains tensile stress on phase change material during heating operation 208. This causes the melting temperature to decrease. Once heating operation 208 is completed, control passes to energizing operation 210.

At energizing operation 210, the transducer applies a tensile stress to the phase change material after the phase change material changes from the crystalline state to the amorphous state. As discussed above, tensile stress applied on the amorphous phase change material may help increase the memory cell's retention time and, therefore, improve the memory cell's performance.

Figure 3:
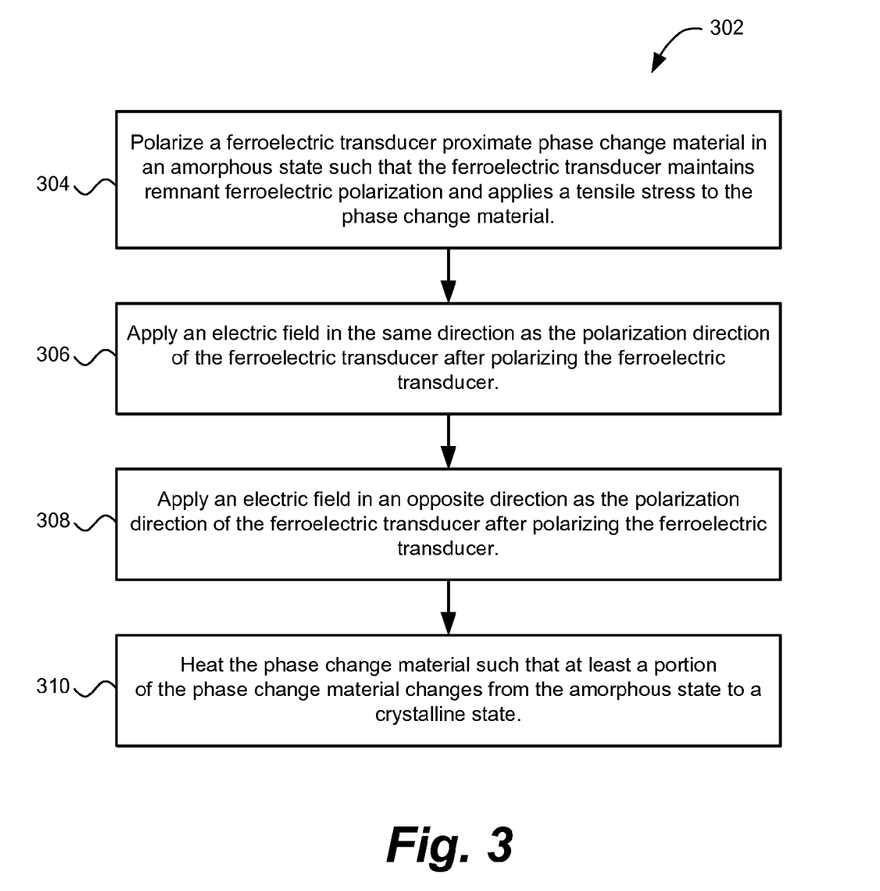
FIG. 3 shows another example flowchart for operating a memory cell contemplated by the present invention.

Turning now to FIG. 3, an example flowchart 302 for operating a memory cell with a ferroelectric transducer proximate the phase change material.

At polarizing step 304, the ferroelectric material proximate the phase change material in an amorphous state is polarized. As discussed above, this step stabilizes the amorphous phase and increases the set speed of the phase change material. This poling step may take place after the reset step and results in a remnant ferroelectric polarization.

For the poling, the voltage pulse amplitude is lower than the threshold voltage of the phase change material and the resulting electrical field is larger than the coercive field of the ferroelectric material. Moreover, the polarization direction of the ferroelectric depends on the polarity of the voltage pulse, but the remnant polarization direction leads to a tensile stress exerted at the phase change material.

At applying operation 306, an electric field is applied in the same direction as the polarization direction of the ferroelectric transducer after polarizing the ferroelectric transducer. Applying an electric field in the polarization direction will further increase the tensile stress on the phase change material. The tensile stress exerted on the phase change memory material will reduce the drift in resistivity and in threshold voltage, and will increases the stability of the amorphous phase.

At a time later, applying operation 308 applies an electric field in an opposite direction as the polarization direction of the ferroelectric transducer after polarizing the ferroelectric transducer. This step tunes the stress exerted through the ferroelectric material, thus tuning the phase change material just before crystallization (the set step) or concomitant to it. During the set step, or just before, the applied voltage is such that it generates a field opposite to that of the remnant polarization, and it exerts a compressive stress to the phase change material. Exerting a compressive stress to the phase change material before or during crystallization results in a faster crystallization process.

Next, heating step 310 heats the phase change material such that at least a portion of the phase change material changes from the amorphous state to a crystalline state. During this operation, the phase change material is heated via the application of a pulse of current which generates the heating and eventually melting of the phase change material. The phase change material is then quenched to obtain the amorphous phase. During the reset step, if the ferroelectric material is heated below its Curie temperature, it will remain ferroelectric and keep a remnant ferroelectric polarization. If it is heated above the Curie temperature, the remnant polarization will disappear. In either case, after the amorphous phase formation, it may be desirable to pole again the ferroelectric material to induce a maximum remnant polarization.

Figure 4:
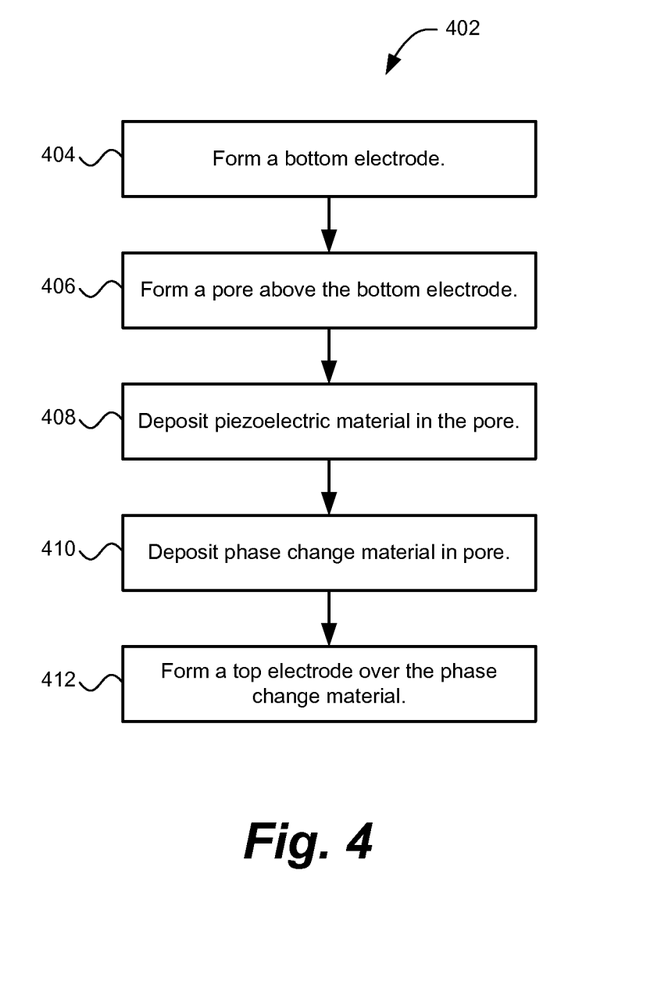
FIG. 4 shows an example flowchart for fabricating a phase change memory cell in accordance with the present invention.

FIG. 4 shows an example flowchart 402 for fabricating a phase change memory cell in accordance with the present invention. The method begins at operation 404 where a bottom electrode is formed in an insulating substrate. As discussed above, the bottom electrode may be made from various electrically conductive materials, such as titanium nitride (TiN), tantalum nitride (TaN), tantalum silicon nitride (TaSiN), Ruthenium (Ru), tungsten (W), silver (Ag), gold (Au), or aluminum (Al). Furthermore, the insulating substrate may be, for example, silicon dioxide (SiO2). Those skilled in the art will recognize that various methods may be employed to deposit the bottom electrode onto the insulating substrate, such as sputter deposition.

Next, at operation 406, a pore is created in the insulating layer centered above the bottom electrode. The pore may be formed, for example, using a chemical etch. As discussed above, in one embodiment, the pore is approximately 500 nm for a 180 nm CMOS technology, and its aspect ratio is at least 2:1.

Next, at operation 408, piezoelectric material in the pore is deposited in the pore. In one embodiment of the invention, depositing the piezoelectric material in the pore includes conforming the piezoelectric material to at least one wall defining the pore such that the piezoelectric material is deposited between the phase change material and the at least one wall. Various known piezoelectric materials may be used such as Aluminum Nitride (AlN), zinc oxide (ZnO), lead zirconate titanate (PZT), BaTiO$_3$(BTO), YMnO$_3$ (YMO), Pb (Mg$_{0.33}$ Nb$_{0.66}$)$_{1-x}$Ti$_x$O$_3$ (PMN-PT) or triglycine sulfate (TGS). The piezoelectric material may be deposited in the pore using various techniques known to those skilled in the art, such as a chemical vapor deposition (CVD).

Next, at operation 410, phase change material is deposited in the pore proximate the piezoelectric material. As mentioned above, the phase change material may include such material as Ge$_2$Sb$_2$Te$_5$ (GST), SbTe, and In$_2$Se$_3$.

Once operation 410 is completed, process flow continues to operation 412. At operation 412, a top electrode is formed over the phase change material. As with the bottom electrode, the top electrode is formed using, for example, sputter deposition. The top electrode may be fabricated from various electrically conductive materials, such as titanium nitride (TiN), tantalum silicon nitride (TaSiN), Ruthenium (Ru), tungsten (W), silver (Ag), gold (Au), or aluminum (Al).

Figure 5:
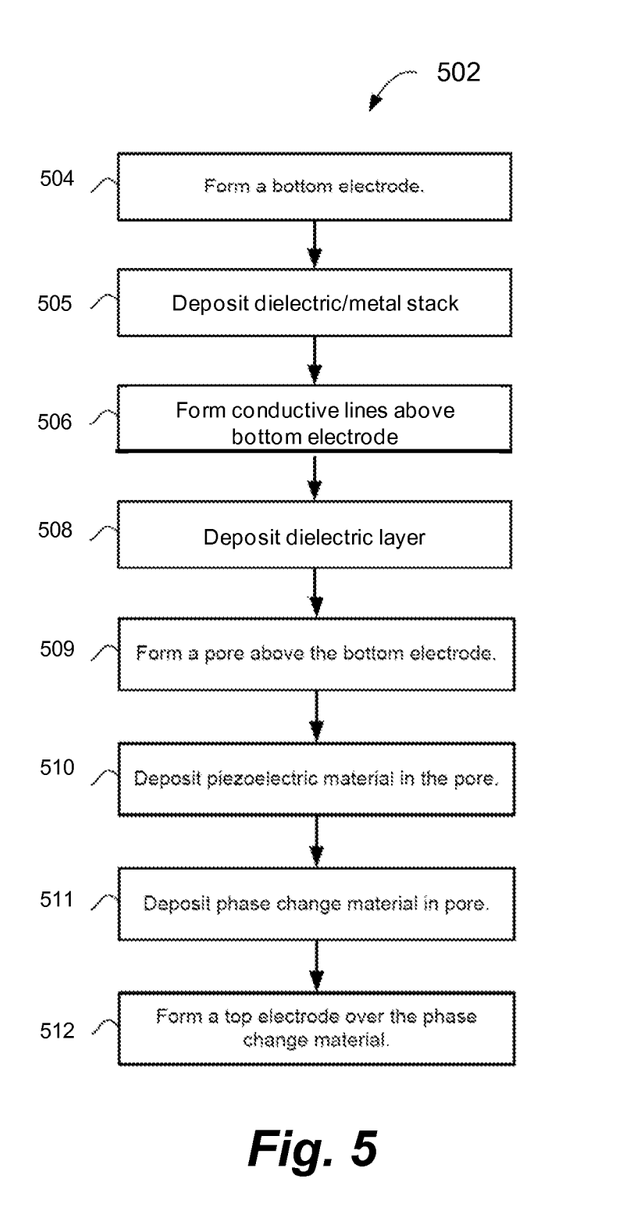
FIG. 5 shows an example flowchart for fabricating another phase change memory cell in accordance with the present invention.

FIG. 5 shows an example flowchart 502 for fabricating yet a second phase change memory cell 150 shown in FIG. 1B in accordance with the present invention. The method begins at operation 504 where a bottom electrode 152 is formed in an insulating substrate. As discussed above, the bottom electrode may be made from various electrically conductive materials, such as titanium nitride (TiN), tungsten (W), tantalum nitride (TaN), tantalum silicon nitride (TaSiN), Ruthenium (Ru), or aluminum (Al). Furthermore, the insulating substrate may be, for example, silicon dioxide (SiO2). Those skilled in the art will recognize that various methods may be employed to deposit the bottom electrode onto the insulating substrate, such as sputter deposition.

Next, at operation 505, at least a first stack is formed by depositing a layer of insulating dielectric material 154, such as silicon oxide or silicon nitride, followed by a conductive layer 155. The conductive layer 155 may be fabricated from various electrically conductive materials, such as titanium nitride (TiN), tungsten (W), tantalum nitride (TaN), tantalum silicon nitride (TaSiN), Ruthenium (Ru), silver (Ag), gold (Au), or aluminum (Al).

Next, at operation 506, the conductive layer 155 is patterned to create conductive lines 156 centered above the bottom electrode Next, at operation 508, the first stack is completed by depositing another layer of insulating material 157 on top of the patterned conducting lines 156. It is clear to those skilled in the art that operations 505-508 can be repeated to create additional layers of conductive lines.

Next, at operation 509, a pore 158 is created in the second stack formed by the two insulating layers and the interposed patterned conducting lines, centered above the bottom electrode. In one embodiment of the invention the pore 158 may be formed, for example, using a chemical etch, and at least one wall exposes a portion 1155 of the patterned conducting lines 156. As discussed above, in one embodiment, the pore is approximately 500 nm for a 180 nm CMOS technology, and its aspect ratio is at least 2:1.

Next, at operation 510, piezoelectric material or ferroelectric material 160 is deposited in the pore. In one embodiment of the invention, depositing the piezoelectric material or ferroelectric material 160 in the pore includes conforming the piezoelectric material or ferroelectric material to at least one wall defining the pore such that the piezoelectric material or ferroelectric material is deposited between the phase change material and the at least one wall in contact with the exposed portion 1155 of the patterned conducting lines 156. Various known piezoelectric materials and ferroelectric materials may be used such as Aluminum Nitride (AlN), zinc oxide (ZnO), lead zirconate titanate (PZT), BaTiO$_3$(BTO), YMnO$_3$ (YMO), Pb(Mg$_{0.33}$ Nb$_{0.66}$)$_{1-x}$Ti$_x$O$_3$ (PMN-PT) or triglycine sulfate (TGS). The piezoelectric material or ferroelectric material may be deposited in the pore using various techniques known to those skilled in the art, such as a chemical vapor deposition (CVD).

Next, at operation 511, phase change material 162 is deposited in the pore proximate the ferroelectric material or ferroelectric material and making contact with the bottom electrode. As mentioned above, the phase change material may include such material as Ge$_2$Sb$_2$Te$_5$ (GST), SbTe, and In$_2$Se$_3$.

Once operation 511 is completed, process flow continues to operation 512. At operation 512, a top electrode 164 is formed over the phase change material. As with the bottom electrode, the top electrode is formed using, for example, sputter deposition. The top electrode may be fabricated from various electrically conductive materials, such as titanium nitride (TiN), tungsten (W), tantalum nitride (TaN), tantalum silicon nitride (TaSiN), Ruthenium (Ru), silver (Ag), gold (Au), or aluminum (Al).

Figure 6:
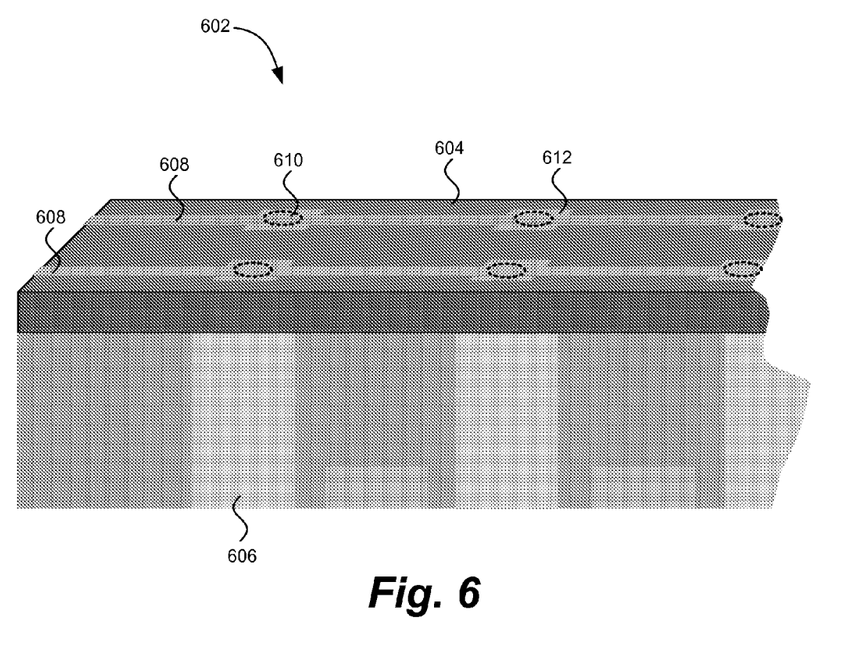
FIG. 6 shows an example intermediate fabrication structure of an embodiment of the invention.

Turning now to FIG. 6, an example intermediate fabrication structure 602 of the invention is shown. The structure 602 includes an insulating layer 604 deposited over one or more bottom electrodes 606. As discussed above, the insulating layer 604 may be composed, for example, of silicon dioxide (SiO2). The bottom electrode 604 may be composed, for example, of tungsten (W).

An intermediate electrode 608 is carried by the insulating layer 604. In one embodiment, the intermediate electrodes 608 are composed of aluminum (Al). As shown, the intermediate electrodes form a conductive layer patterned to create conductive pads 612 centered above the bottom electrode 606 and, once the pores 610 are created in the insulating layer 604, surround the pores 610. This configuration allows the intermediate electrodes 608 to activate a portion of the piezoelectric material.

Figure 7:
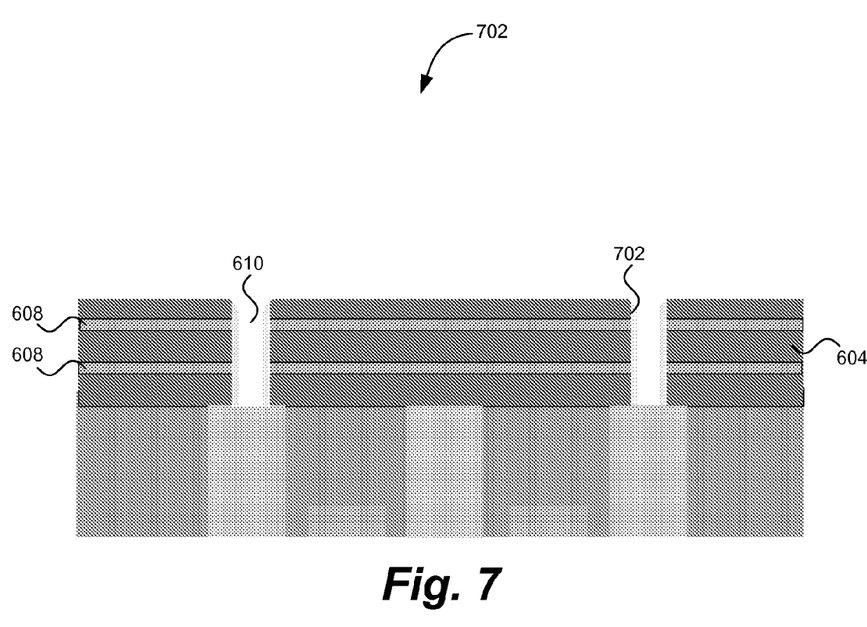
FIG. 7 shows cross-sectional view of a further intermediate fabrication structure of an embodiment of the invention.

At FIG. 7, a cross-sectional view of a further intermediate fabrication structure 702 is shown. The structure 702 illustrates several intermediate electrodes 608 carried by the insulating layer 604. The intermediate electrodes 608 are electrically coupled to the piezoelectric material 704 within the pore 610. By selectively energizing the intermediate electrodes 608, various portions of the piezoelectric material 704 may be activated.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preferred embodiments to the invention has been described, it will be understood that those skilled in the art, both now and in the future, may make various improvements and enhancements which fall within the scope of the claims which follow. Thus, the claims should be construed to maintain the proper protection for the invention first described.

What is claimed is:

1. A memory cell comprising:
   phase change material switchable between at least an amorphous state and a crystalline state;
   a piezoelectric transducer positioned proximate the phase change material, the piezoelectric transducer configured to activate when the phase change material is at the amorphous state; and
   a controller configured to, before changing the phase change material from the amorphous phase to the crystalline phase, apply a first electrical pulse polarizing the piezoelectric material such that the piezoelectric transducer applies a tensile stress upon the phase change material.

2. The memory cell of claim 1, wherein the piezoelectric transducer includes a ferroelectric material.

3. The memory cell of claim 2, further comprising:
   wherein the phase change material and the piezoelectric transducer are fabricated such that an electrical field corresponding to the threshold voltage of the phase change material is greater than a coercive field of the ferroelectric material; and
   wherein the threshold voltage is a first voltage across the phase change material to cause the phase change material to change from the amorphous state to the crystalline state.

4. The memory cell of claim 3, further comprising a controller configured to, before changing the phase change material from the amorphous phase to the crystalline phase, apply a first electrical pulse polarizing the ferroelectric material such that the piezoelectric transducer applies a tensile stress upon the phase change material, the first electrical pulse having a voltage below the threshold voltage.

5. The memory cell of claim 4, wherein the controller is configured to, after changing the phase change material from the crystalline phase to the amorphous phase, apply a second electrical pulse, polarizing the ferroelectric material such that the piezoelectric transducer applies a compressive stress upon the phase change material, the second electrical pulse having a voltage of opposite polarity to the first electrical pulse.

6. The memory cell of claim 2, further comprising:
   wherein the phase change material and the ferroelectric material are fabricated such that a crystallization temperature of the phase change material is less than a Curie temperature of the ferroelectric material;
   wherein the crystallization temperature is a first temperature above which the phase change material at the amorphous state crystallizes to the crystalline state; and
   wherein the Curie temperature being a second temperature above which the ferroelectric material does not exhibit a spontaneous polarization.

7. The memory cell of claim 2, further comprising:
   a first electrode; and
   at least a second electrode; and
   wherein the phase change material and the piezoelectric transducer are positioned, at least partially, between the first electrode and the second electrode.

8. The memory cell of claim 2, further comprising:
   an insulating layer defining a pore;
   a bottom electrode positioned below the pore;
   a top electrode positioned above the pore; and
   wherein the phase change material is positioned within the pore and between the bottom electrode and the top electrode; and
   wherein the piezoelectric transducer is positioned between the phase change material and the insulating layer.

9. The memory cell of claim 2, wherein the piezoelectric transducer is configured to apply a tensile stress to at least a portion of the phase change material before the phase change material is changed from the amorphous state to the crystalline state.

10. The memory cell of claim 2, wherein the piezoelectric transducer is configured to apply a compressive stress to at least a portion of the phase change material after the phase change material is changed from the crystalline state to the amorphous state.

11. The memory cell of claim 1, further comprising:
    a first electrode; and
    at least a second electrode; and
    wherein the phase change material and the piezoelectric transducer are positioned, at least partially, between the first electrode and the second electrode.

12. The memory cell of claim 1, further comprising:
    an insulating layer defining a pore;
    a bottom electrode positioned below the pore;
    a top electrode positioned above the pore; and
    wherein the phase change material is positioned within the pore and between the bottom electrode and the top electrode; and
    wherein the piezoelectric transducer is positioned between the phase change material and the insulating layer.

13. The memory cell of claim 1, wherein the piezoelectric transducer is configured to apply a tensile stress to at least a portion of the phase change material before the phase change material is changed from the amorphous state to the crystalline state.

14. A method of operating a memory cell, the method comprising:
    polarizing a ferroelectric transducer proximate phase change material in an amorphous state such that the ferroelectric transducer maintains remnant ferroelectric polarization and applies a tensile stress to at least a portion of the phase change material.

15. The method of claim 14, further comprising:
    applying an electric field in the same direction as the polarization direction of the ferroelectric transducer after polarizing the ferroelectric transducer.

16. The method of claim 14, further comprising:
    applying an electric field in an opposite direction as the polarization direction of the ferroelectric transducer after polarizing the ferroelectric transducer; and
    after applying the electric field in the opposite direction as the polarization direction, heating the phase change material such that at least a portion of the phase change material changes from the amorphous state to a crystalline state.

17. The method of claim 14, wherein applying the electric field comprises:
    applying an electric current through the ferroelectric material such that a voltage drop across the ferroelectric material is greater than a coercive voltage of the ferroelectric material and less than a threshold voltage of the phase change material.

* * * * *